(12) United States Patent
Wu et al.

(10) Patent No.: US 12,300,598 B2
(45) Date of Patent: May 13, 2025

(54) PACKAGE STRUCTURE AND METHOD OF FABRICATING THE SAME

(71) Applicant: Taiwan Semiconductor Manufacturing Company, Ltd., Hsinchu (TW)

(72) Inventors: Yi-Wen Wu, New Taipei (TW); Hung-Jui Kuo, Hsinchu (TW); Ming-Che Ho, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 802 days.

(21) Appl. No.: 17/180,877

(22) Filed: Feb. 22, 2021

(65) Prior Publication Data

US 2021/0175168 A1  Jun. 10, 2021

Related U.S. Application Data

(63) Continuation of application No. 16/416,278, filed on May 20, 2019, now Pat. No. 10,930,586, which is a
(Continued)

(51) Int. Cl.
*H01L 23/522* (2006.01)
*H01L 21/768* (2006.01)
(Continued)

(52) U.S. Cl.
CPC .... *H01L 23/5226* (2013.01); *H01L 21/76802* (2013.01); *H01L 21/76877* (2013.01); *H01L 23/53204* (2013.01); *H01L 23/5389* (2013.01); *H01L 24/05* (2013.01); *H01L 24/09* (2013.01); *H01L 24/13* (2013.01); *H01L 24/14* (2013.01); *H01L 24/19* (2013.01); *H01L 24/20* (2013.01); *H01L 25/105* (2013.01); *H01L 24/11* (2013.01); *H01L 24/16* (2013.01);
(Continued)

(58) Field of Classification Search
CPC ... H01L 24/19–20; H01L 2224/19–225; H01L 24/96; H01L 2224/96
See application file for complete search history.

(56) References Cited

U.S. PATENT DOCUMENTS 7,741,148 B1 * 6/2010 Marimuthu ......... H01L 23/3121
438/106
8,987,900 B2 * 3/2015 Kim ...................... H01L 21/768
257/737

(Continued)

*Primary Examiner* — Eric A. Ward
*Assistant Examiner* — Nora T. Nix
(74) *Attorney, Agent, or Firm* — JCIPRNET

(57) ABSTRACT

Provided is a package structure including a die; an electrically connecting structure having a die attach region and a peripheral region surrounding the die attach region, wherein the die is disposed on the electrically connecting structure within the die attach region; an insulating protrusion disposed in the peripheral region and extending in a thickness direction of the die; a conductive structure disposed on the electrically connecting structure and encapsulating the insulating protrusion, wherein the conductive structure is electrically coupled to the electrically connecting structure and the die; and a dielectric structure disposed on the electrically connecting structure and encapsulating the die and the conductive structure.

20 Claims, 6 Drawing Sheets

Related U.S. Application Data continuation of application No. 15/716,476, filed on Sep. 26, 2017, now Pat. No. 10,297,544.

(51) Int. Cl.
*H01L 23/00* (2006.01)
*H01L 23/532* (2006.01)
*H01L 23/538* (2006.01)
*H01L 25/10* (2006.01)

(52) U.S. Cl.
CPC ............ *H01L 2224/02331* (2013.01); *H01L 2224/0239* (2013.01); *H01L 2224/04105* (2013.01); *H01L 2224/05644* (2013.01); *H01L 2224/05655* (2013.01); *H01L 2224/05657* (2013.01); *H01L 2224/05664* (2013.01); *H01L 2224/11002* (2013.01); *H01L 2224/11334* (2013.01); *H01L 2224/11849* (2013.01); *H01L 2224/12105* (2013.01); *H01L 2224/1403* (2013.01); *H01L 2224/14181* (2013.01); *H01L 2224/16227* (2013.01); *H01L 2224/221* (2013.01); *H01L 2924/15174* (2013.01)

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 9,570,400 B2 * | 2/2017 | Baek .............. H01L 24/19 |
| 2013/0328211 A1 * | 12/2013 | Shimizu .......... H01L 25/105 257/774 |
| 2013/0334682 A1 * | 12/2013 | Kim .............. H01L 24/14 257/737 |
| 2018/0033732 A1 * | 2/2018 | Sakamoto ........ H01L 21/486 |
| 2018/0130745 A1 * | 5/2018 | Hu .............. H01L 24/03 |
| 2018/0226377 A1 * | 8/2018 | Geissler .......... H01L 24/27 |

* cited by examiner

PACKAGE STRUCTURE AND METHOD OF FABRICATING THE SAME

CROSS-REFERENCE TO RELATED APPLICATION

This is a continuation application of and claims the priority benefit of U.S. application Ser. No. 16/416,278, filed on May 20, 2019, now allowed. The U.S. application Ser. No. 16/416,278 is a continuation application of and claims the priority benefit of U.S. application Ser. No. 15/716,476, filed on Sep. 26, 2017, now U.S. Pat. No. 10,297,544, issued on May 21, 2019. The entirety of each of the above-mentioned patent applications is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

Currently, integrated fan-out packages are becoming increasingly popular for their compactness. In the integrated fan-out packages, the formation of the redistribution circuit structure plays an important role during packaging process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
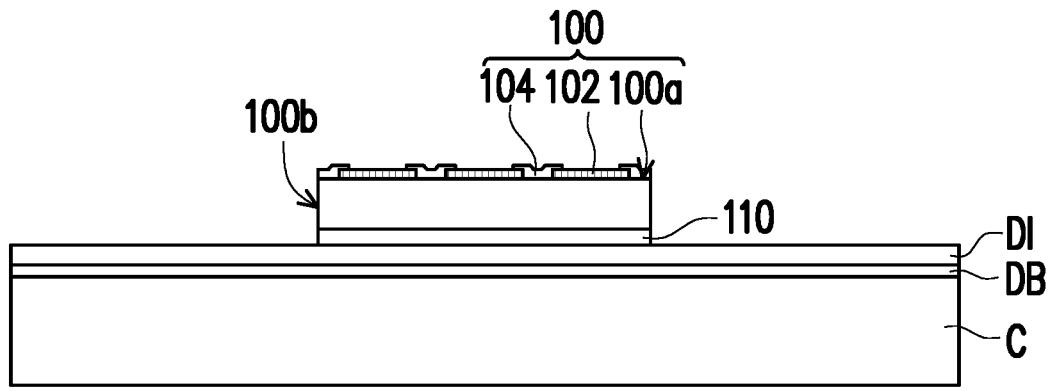
FIGS. 1 through 12 illustrate a process flow for fabricating an integrated fan-out package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1 through 12 illustrate a process flow for fabricating an integrated fan-out package in accordance with some embodiments.

Referring to FIG. 1, a carrier C having a de-bonding layer DB and a dielectric layer DI formed thereon is provided, wherein the de-bonding layer DB is formed between the carrier C and the dielectric layer DI. In some embodiments, the carrier C is a glass substrate, the de-bonding layer DB is a light-to-heat conversion (LTHC) release layer formed on the glass substrate, and the dielectric layer DI is a photosensitive polybenzoxazole (PBO) or polyimide (PI) layer formed on the de-bonding layer DB, for example. In alternative embodiments, the de-bonding layer DB may be a photo-curable release film whose viscosity is decreased by photo-curing process or a thermal curable release film whose viscosity is decreased by thermal-curing process, and the dielectric layer DI may be made from other photosensitive or non-photosensitive dielectric materials.

After the carrier C having the de-bonding layer DB and the dielectric layer DI formed thereon is provided, a die 100 including an active surface 100a and a plurality of sidewalls 100b is then mounted on the carrier C having the dielectric layer DI formed thereon. In some embodiments, the die 100 further includes a plurality of pads 102 distributed on the active surface 100a and a passivation layer 104. In other words, the die 100 is mounted on the dielectric layer DI. As shown in FIG. 1, the passivation layer 104 covers the active surface 100a of the die 100, and the pads 102 are partially exposed by the passivation layer 104. In some embodiments, the pads 102 are aluminum pads or other metal pads, and the passivation layer 104 is a photosensitive polybenzoxazole (PBO) or polyimide (PI) layer, for example.

In some embodiments, the die 100 is adhered with the dielectric layer DI through a die-attach film (DAF) 110 or the like. For example, the material of the die-attach film 110 includes phenolic base materials or epoxy base materials.

Figure 2:
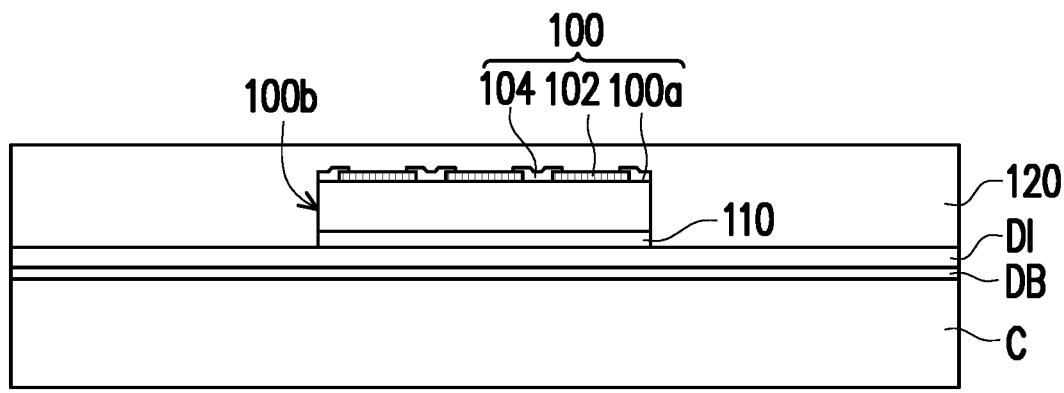

Referring to FIG. 2, an insulating material 120 is formed on the dielectric layer DI so as to cover the die 100 and the die-attach film 110. In some embodiments, the insulating material 120 is a molding compound formed by molding process. The pads 102 and the passivation layer 104 of the die 100 are entirely covered by the insulating material 120. Furthermore, the sidewalls 100b of the die 100 are encapsulated by the insulating material 120. The maximum thickness of the insulating material 120 is greater than the thickness of the die 100 such that the sidewalls 100b, the pads 102 and the passivation layer 104 of the die 100 are not revealed by the insulating material 120. In other words, the top surface of the insulating material 120 is higher than the active surface 100a of the die 100. The insulating material 120 includes epoxy or other suitable resins, for example. In some alternative embodiments, the insulating material 120 may be formed by photo pattern-able molding compounds, such as phenolic resin, epoxy resin, or combinations thereof. That is, the insulating material 120 is able to be patterned by a photolithography method. In some embodiments, the insulating material 120 may further include inorganic filler or inorganic compound (e.g. silica, clay, and so on) can be added therein so as to optimize coefficient of thermal expansion (CTE) of the insulating material 120.

As shown in FIG. 2, the dimension (e.g., thickness and width) of the insulating material 120 is greater than the dimension (e.g., thickness and width) of the die 100. The insulating material 120 not only covers the dielectric layer DI, but also encapsulates the active surface 100a and the sidewalls 100b of the die 100. In some embodiments, the insulating material 120 may have a planar top surface.

Figure 3:
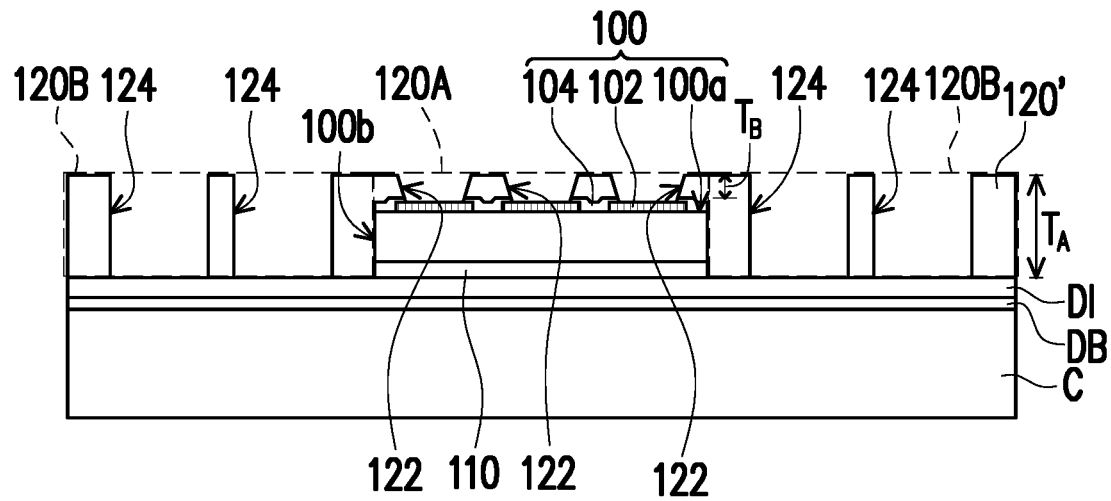

Referring to FIG. 3, after the insulating material 120 is formed, the insulating material 120 is patterned to form an insulating encapsulation 120'. The insulating encapsulation 120' partially encapsulates the active surface 100a of the die 100 and entirely encapsulates the sidewalls 100b of the die 100. The insulating encapsulation 120' includes a plurality of first contact openings 122 for exposing the pads 102 and a plurality of through holes 124 for exposing the dielectric layer DI. In some embodiments, the insulating encapsulation 120' may include a first encapsulation portion 120A and a second encapsulation portion 120B connected to the first encapsulation portion 120A, wherein the first encapsulation portion 120A covers the active surface 100a of the die 100, and the second encapsulation portion 120B covers the sidewalls 100b of the die 100 and extends outward from the first encapsulation portion 120A and the sidewalls 100b of the die 100.

As shown in FIG. 3, the thickness $T_A$ of the first encapsulation portion 120A is smaller than the thickness $T_B$ of the second encapsulation portion 120B. The first contact openings 122 are formed and distributed in the first encapsulation portion 120A of the insulating encapsulation 120', while the through holes 124 are formed and distributed in the second encapsulation portion 120B of insulating encapsulation 120'.

As shown in FIG. 2 and FIG. 3, the first contact openings 122 and the through holes 124 distributed in the insulating encapsulation 120' may be simultaneously formed by the photolithography method when the insulating material 120 is formed by photo pattern-able molding compounds. However, the patterning method of the insulating material 120 is not limited thereto. In some alternative embodiments, since the first contact openings 122 and the through holes 124 are different in dimension and require different process requirements, the first contact openings 122 and the through holes 124 may be formed by different processes respectively. For example, during the formation (e.g., a molding process) of the insulating material 120, the through holes 124 are formed simultaneously, and the first contact openings 122 are then formed in the insulating material 120 having the through holes 124. The insulating material 120 having the through holes 124 distributed therein are formed by molding process, and the first contact openings 122 are formed by the photolithography method, for instance.

The dimension (e.g., depth and width) of the first contact openings 122 formed in the first encapsulation portion 120A is smaller than the dimension (e.g., depth and width) of through holes 124 formed in the second encapsulation portion 120B. In some embodiments, the arranging pitch of the first contact openings 122, i.e., the distance between two adjacent first contact openings 122, is smaller than that of the through holes 124.

Figure 6:
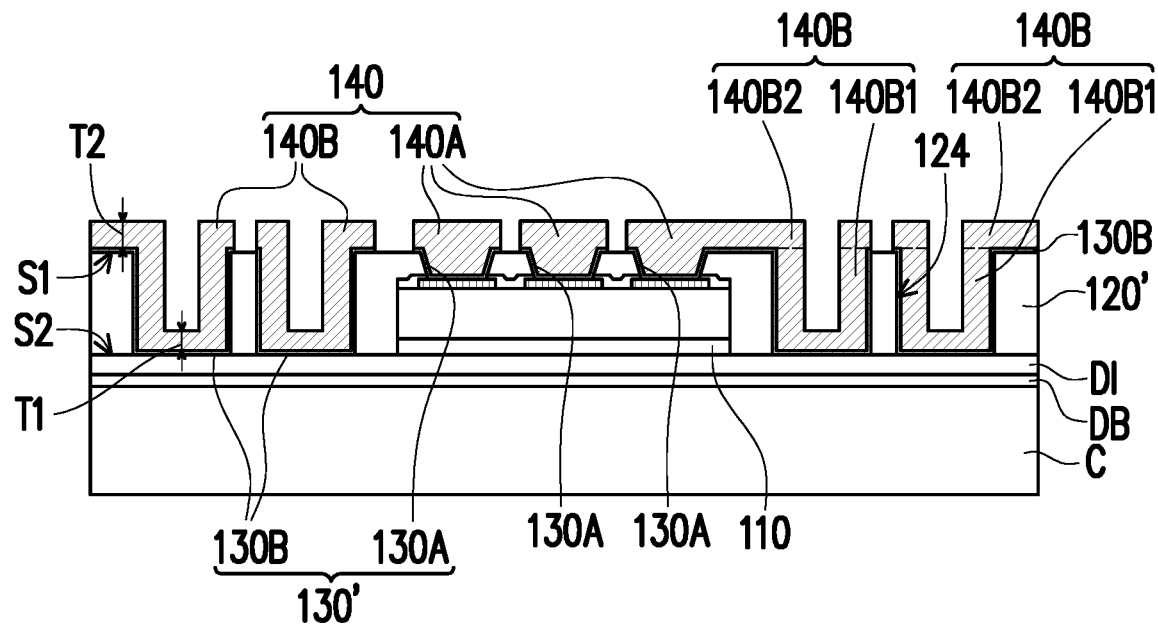
Figure 7:
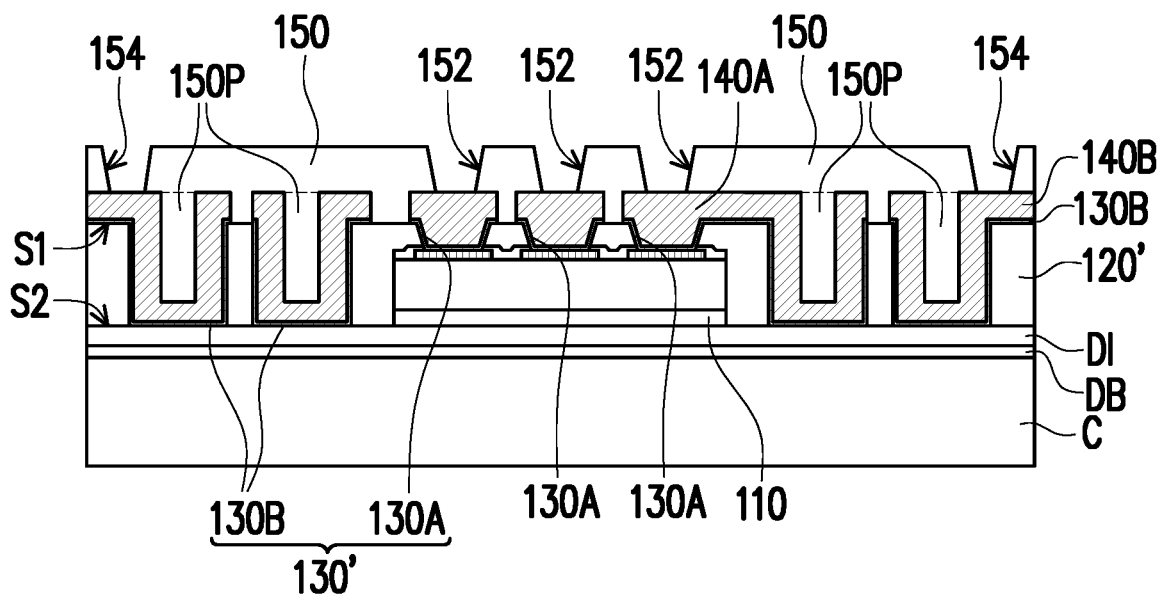
Figure 8:
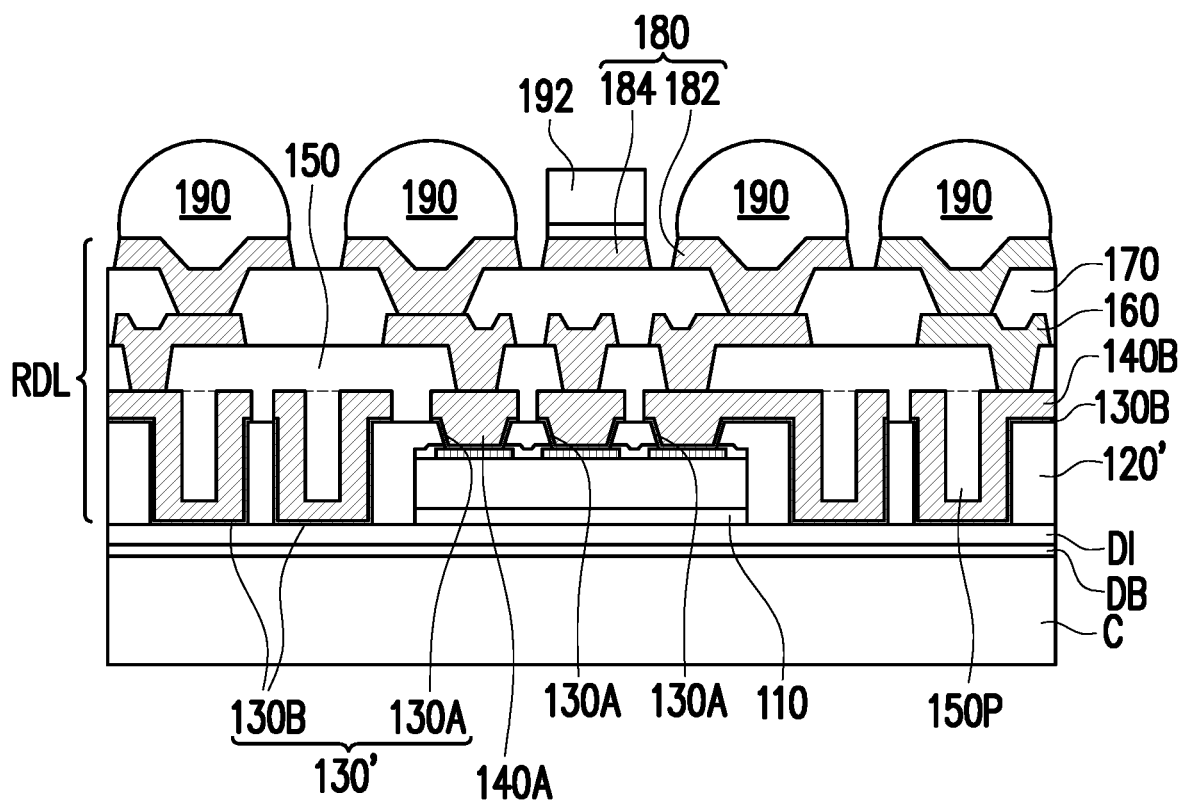

Referring to FIG. 4 through FIG. 8, after the insulating encapsulation 120' is formed, a redistribution circuit structure RDL (as shown in FIG. 8) electrically connected to the pads 102 of the die 100 is formed on the insulating encapsulation 120' and on portions of the dielectric layer DI exposed by the through holes 124. The redistribution circuit structure RDL (shown in FIG. 8) is fabricated to electrically connect to the pads 102 of the die 100. The fabrication process flow of the redistribution circuit structure RDL (shown in FIG. 8) is described in accompany with FIG. 4 through FIG. 8 in detail.

Figure 4:
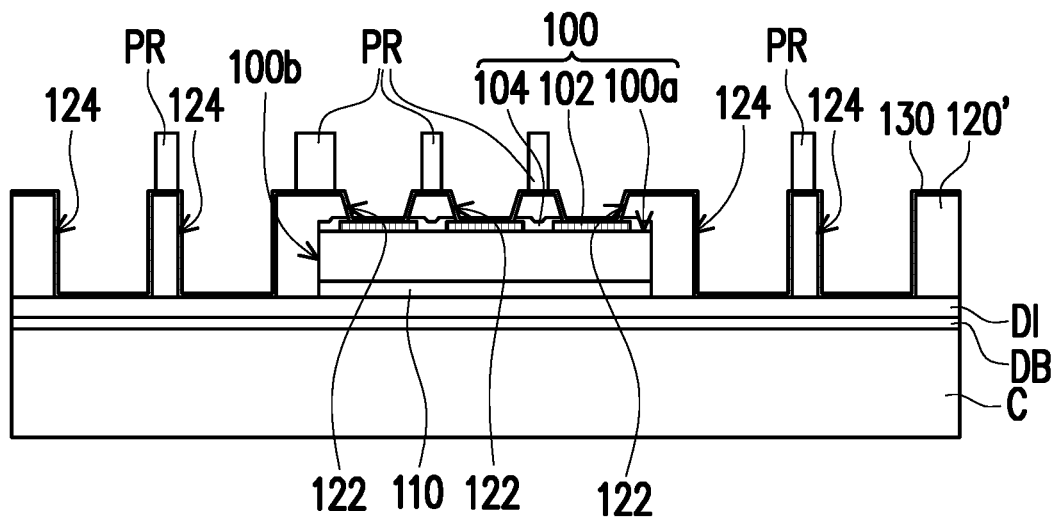

Referring to FIG. 4, a seed layer 130 is conformally sputtered, for example, on the insulating material 120', the pads 102 exposed by the first contact openings 122, and the portions of the dielectric layer DI exposed by the through holes 124. For example, the seed layer 130 is a titanium/copper composited layer, wherein the sputtered titanium thin film is in contact with the insulating material 120', the pads 102 exposed by the first contact openings 122, and the portions of the dielectric layer DI exposed by the through holes 124. In addition, the sputtered copper thin film is formed on the sputtered titanium thin film. After the seed layer 130 is deposited, a patterned photoresist layer PR is formed on the seed layer 130. The patterned photoresist layer PR includes openings corresponding to the first contact openings 122 and the through holes 124, and portions of the seed layer 130 are exposed by the openings of the photoresist layer PR. In some embodiments, such the seed layer 130 is a conformal layer. That is, the seed layer 130 has a substantially equal thickness extending along the region on which the seed layer 130 is formed.

It is noted that, in some embodiments, before the seed layer 130 is formed, no additional dielectric material is required to be formed over the insulating encapsulation 120'. The insulating encapsulation 120' provides a planar surface for fabrication of the sequentially formed redistribution circuit structure RDL (shown in FIG. 8).

Figure 5:
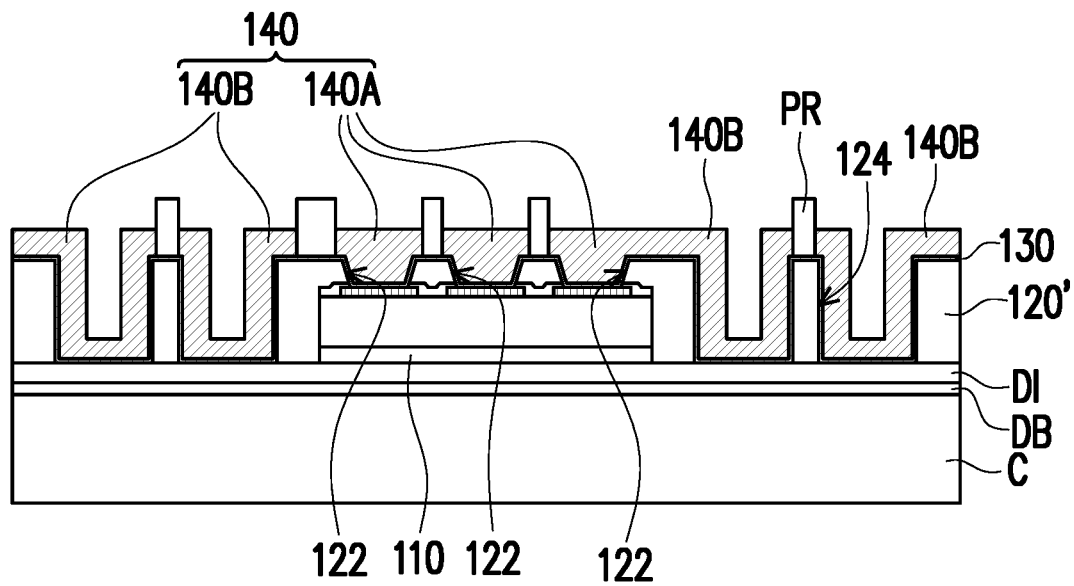

Referring to FIG. 5, a redistribution conductive layer 140 is formed on portions of the seed layer 130. In some embodiments, the redistribution conductive layer 140 is formed on the portions of the seed layer 130 exposed by the openings of the patterned photoresist layer PR by a plating process. In some embodiments, the redistribution conductive layer 140 includes a plurality of first conductive patterns 140A corresponding to the first contact openings 122 and a plurality of second conductive patterns 140B corresponding to the through holes 124. Since the dimension (e.g., depth and width) of the first contact openings 122 is smaller than the dimension (e.g., depth and width) of through holes 124, the gap filling capacity of the first conductive patterns 140A is more obvious than that of the second conductive patterns 140B. Accordingly, the first contact openings 122 may be filled by the first conductive patterns 140A, and the through holes 124 may not be filled up the second conductive patterns 140B. As shown in FIG. 5, the second conductive patterns 140B conformally cover the surface of the insulating encapsulation 120' in the proximity of the through holes 124 such that the through holes 124 are partially occupied by the second conductive patterns 140B. In other words, the through holes 124 are not fully occupied by the second conductive patterns 140B. In some embodiments, the second conductive patterns 140B in the through holes 124 are formed as cup-shaped structures. From the cross-section view of FIG. 5, the second conductive patterns 140B in the through holes 124 are formed as U-shape. In some alternative embodiments, the profile and the gap filling capacity of the second conductive patterns 140B may be modified through proper adjustment of thin-film deposition recipe.

Referring to FIG. 6, after the redistribution conductive layer 140 is formed, the patterned photoresist layer PR is stripped such that the portions of the seed layer 130 that are not covered by the redistribution conductive layer 140 are exposed.

As shown in FIG. 6, by using the redistribution conductive layer 140 as a hard mask, the portions of the seed layer 130 uncovered by the redistribution conductive layer 140 are removed so as to form a patterned seed layer 130' under the redistribution conductive layer 140. The patterned seed layer 130' includes a plurality of first seed patterns 130A and a plurality of second seed patterns 130B. The first seed patterns 130A are between the pads 102 and the first conductive patterns 140A, and the second seed patterns 130B are between the insulating encapsulation 120' and the second conductive patterns 140B. In some embodiments, the seed layer 130 is patterned by etching until the insulating encapsulation 120' is exposed. After the patterned seed layer 130' is formed under the redistribution conductive layer 140, the first conductive patterns 140A of the redistribution conductive layer 140 are electrically connected to the pads 102 of the die 100 through the first seed patterns 130A in the first contact openings 122.

As shown in FIG. 6, the first conductive patterns 140A and the second conductive patterns 140B are not merely distributed within the first contact openings 122 and the through holes 124. The first conductive patterns 140A further extend from the first contact openings 122 of the insulating encapsulation 120' to partially cover the first surface S1 of the insulating encapsulation 120', and the second conductive patterns 140B further extend from the through holes 124 of the insulating encapsulation 120' to partially cover the first surface S1 of the insulating encapsulation. The second conductive patterns 140B of the redistribution conductive layer 140 penetrate the insulating encapsulation 120', i.e., the second conductive patterns 140B extend from the first surface S1 of the insulating encapsulation to the second surface S2 of the insulating encapsulation. In other words, the second conductive patterns 140B are simultaneously exposed at the first surface S1 and the second surface S2 of the insulating encapsulation 120'. In some embodiments, the second conductive patterns 140B are conformal layers with a substantially equal thickness extending along the region on which the second conductive patterns 140B are formed. In some alternative embodiments, a thickness T1 of the second conductive patterns 140B at bottoms of the through holes 124 is different from a thickness T2 of the second conductive patterns 140B over the first surface S1 of the insulating encapsulation 120'. In some exemplary embodiments, the thickness T1 of the second conductive patterns 140B at bottoms of the through holes 124 is less than the thickness T2 of the second conductive patterns 140B over the first surface S1 of the insulating encapsulation 120'. The thickness T1 of the second conductive patterns 140B at bottoms of the through holes 124 is in a range of 3 μm to 10 μm. The thickness T2 of the second conductive patterns 140B over a first surface S1 of the insulating encapsulation 120' is in a range of 4 μm to 15 μm.

As shown in FIG. 6, the redistribution conductive layer 140 not only re-layouts the pads 102 of the die 100, but also serves as conductive through vias in the insulating encapsulation 120'. In some embodiments, the first conductive patterns 140A of the redistribution conductive layer 140 re-layout the pads 102 of the die 100, and the second conductive patterns 140B of the redistribution conductive layer 140 serve as conductive through vias. In other words, one of the second conductive patterns 140B includes the conductive through via 140B1 in the respective through hole 124 and the conductive layer 140B2 over the first surface S1 of the insulating encapsulation 120'. The conductive through via 140B1 electrically connected to components (e.g., conductive balls 190 and conductive terminals 194 shown in FIG. 11) at the first surface S1 and the second surface S2 of the insulating encapsulation 120', and the conductive layer 140B2 re-layout the pads 102 of the die 100 are simultaneously formed by the plating process. In other words, the fabrication process of the conductive through vias distributed in the insulating encapsulation 120' is integrated into the fabrication process of the bottommost redistribution conductive layer 140 of the redistribution circuit structure. It should be noted that, for some signal transmission purpose, parts of the first conductive patterns 140A may be electrically connected to the second conductive patterns 140B.

Referring to FIG. 7, after the redistribution conductive layer 140 is formed on the insulating encapsulation 120', an inter-dielectric layer 150 is formed to cover the redistribution conductive layer 140 and the insulating encapsulation 120'. The inter-dielectric layer 150 includes dielectric material having a plurality of protrusions 150P extending into the through holes 124. The protrusions 150P of the inter-dielectric layer 150 are in contact with the second conductive patterns 140B of the redistribution conductive layer 140, so that the second conductive patterns 140B are sandwiched between the protrusions 150P and the insulating encapsulation 120' and sandwiched between the protrusions 150P and the dielectric layer DI, as shown in FIG. 7. In other words, the second conductive patterns 140B is engaged with the protrusions 150P of the inter-dielectric layer 150. Furthermore, the inter-dielectric layer 150 may include a plurality of contact openings 152 and 154 for exposing the first conductive patterns 140A and the second conductive patterns 140B.

Referring to FIG. 8, in some embodiments, after the redistribution conductive layer 140 and the inter-dielectric layer 150 are formed, steps illustrated in FIGS. 4 through 7 may be repeated at least one time so as to fabricate the redistribution circuit structure RDL over the die 100 and the insulating encapsulation 120'. The redistribution circuit structure RDL includes a plurality of inter-dielectric layers (150 and 170) and a plurality of redistribution conductive layers (140, 160 and 180) stacked alternately. In some embodiment, the topmost redistribution conductive layer 180 of the redistribution circuit structure RDL may include a plurality of under-ball metallurgy (UBM) patterns 182 for electrically connecting with conductive balls, and/or include at least one connection pad 184 for electrically connecting with at least one passive electronic component.

After the redistribution circuit structure RDL is formed, a plurality of conductive balls 190 are placed on the under-ball metallurgy patterns 182, and a plurality of passive components 192 are mounted on the connection pads 184. In some embodiments, the conductive balls 190 may be placed on the under-ball metallurgy patterns 182 by ball placement process, and the passive components 192 may be mounted on the connection pads 184 through reflow process. It is noted that passive components 192 and the connection pad 184 for electrically connecting with at least one passive component 192 are not necessary in some embodiments.

Figure 9:
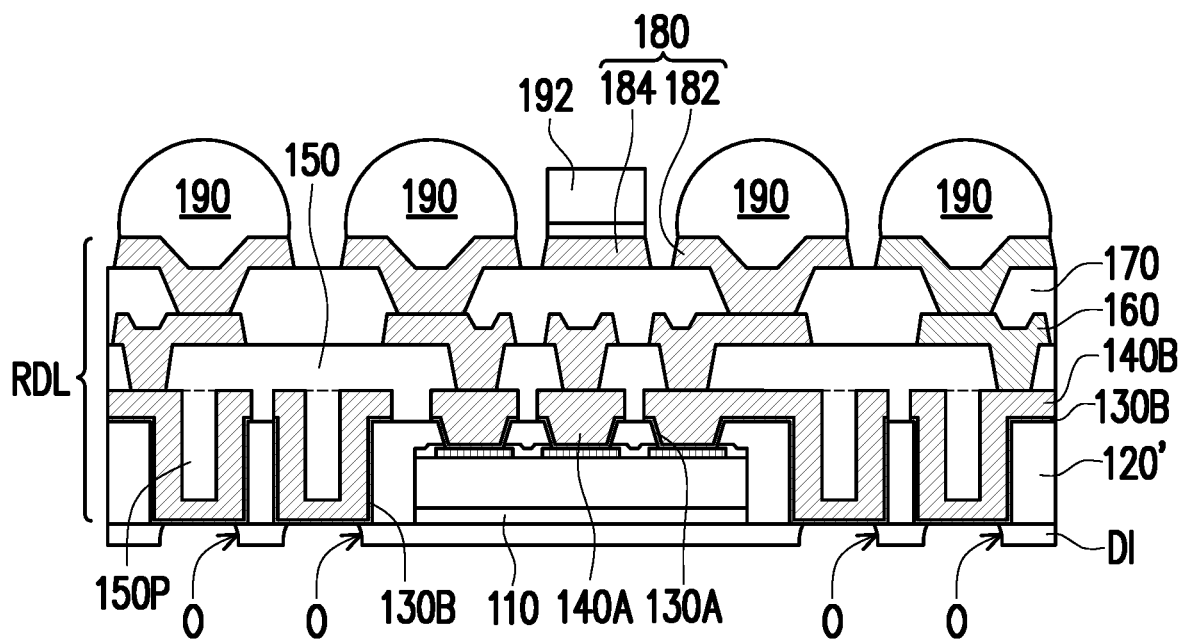

Referring to FIG. 8 and FIG. 9, after the conductive balls 190 and/or the passive components 192 are formed, the dielectric layer DI is de-bonded from the de-bonding layer DB such the dielectric layer DI is separated or delaminated from the de-bonding layer DB and the carrier C. In some embodiments, the de-bonding layer DB (e.g., the LTHC release layer) may be irradiated by an UV laser such that the dielectric layer DI is peeled from the carrier C.

As shown in FIG. 9, the dielectric layer DI is then patterned such that a plurality of second contact openings O are formed to expose portions of the bottom surfaces of the second conductive patterns 140B. The number of the second contact openings O formed in the dielectric layer DI is corresponding to the number of the second conductive patterns 140B in some embodiments.

Figure 10:
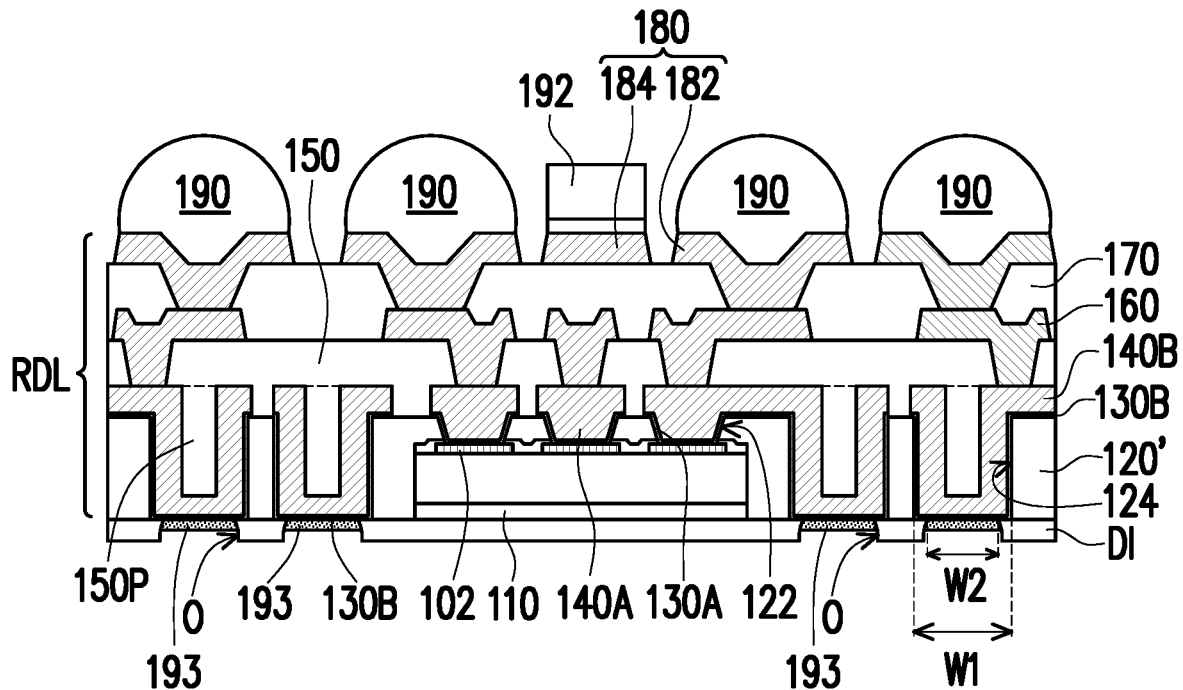

Referring to FIG. 10, after the second contact openings O are formed in the dielectric layer DI, a plurality of barrier layers 193 are formed on the bottom surfaces of the seed layer 130B that are exposed by the second contact openings O. In some embodiments, the barrier layer 193 does not extend out the second contact opening O and does not cover a bottom surface of the dielectric layer DI. The barrier layer 193 is provided to prevent atom such as copper of the second conductive patterns 140B from diffusing into conductive terminals 194 (shown in FIG. 11), so that the formation of an intermetallic compound (IMC) of the second conductive patterns 140B and the conductive terminals 194 (shown in FIG. 11) may be avoided or reduced.

In some embodiments, the barrier layers 193 are formed by an electroless plating method. In other words, reaction solution (not shown) is configured to react with the second conductive patterns 140B, so that the barrier layers 193 are plated over the bottoms of the second conductive patterns 140B. The reaction may be an electroless plating reaction and is selective, so that the barrier layers 193 are plated on the bottoms of the second conductive patterns 140B, and not over the dielectric layer DI. In some embodiments, during the electroless plating reaction, the metal ions in reaction solution are deposited over the bottoms of the second conductive patterns 140B to form barrier layers 193. That is, after the electroless plating reaction is performed, the consumption of the material at the bottoms of the second conductive patterns 140B may be avoided or reduced.

In some embodiments, a material of the barrier layer 193 includes a metal, such as Ni, Au, Pd, Co, or a combination thereof. It should be noted that the material of the barrier layers 193 is different from a material of the redistribution conductive layer 140 (i.e., the second conductive patterns 140B) and a material of the conductive terminals 194 shown in FIG. 11. In some exemplary embodiment in which the redistribution conductive layer 140 may include Cu, and the conductive terminals 194 may include Sn or Sn—Ag alloy, the barrier layers 193 may include electroless Ni. An intermetallic compound (IMC) including Cu and Sn (or Sn—Ag alloy) may not be formed between the redistribution conductive layer 140 and the conductive terminals 194 after a reflow process owing to the barrier layer 193. Therefore, the crack because of IMC including Cu and Sn or Sn—Ag alloy is able to be avoided, and reliability of the integrated fan-out package is increased.

In some embodiments, a minimum thickness of the barrier layers 193 is at least greater than 0.5 μm, otherwise the IMC crack issue between the redistribution conductive layer 140 and the conductive terminals 194 may occur. That is, the barrier layers 193 formed between the redistribution conductive layer 140 and the conductive terminals 194 is able to prevent the IMC crack issue. In some alternative embodiments, a thickness of the barrier layers 193 is in a range of greater than 0.5 μm to 5 μm.

In some embodiments, since the barrier layers 193 are formed by the electroless plating, the barrier layers 193 are formed over bottoms of the second contact openings O in a self-alignment manner. That is, the barrier layers 193 are merely disposed at bottoms of the second contact openings O, while not extending out of the second contact openings O, as shown in FIG. 10. After the barrier layers 193 are formed, the second conductive patterns 140B of the redistribution conductive layer 140 are sandwiched between the protrusions 150P of the inter-dielectric layer 150 and the barrier layers 193.

Figure 11:
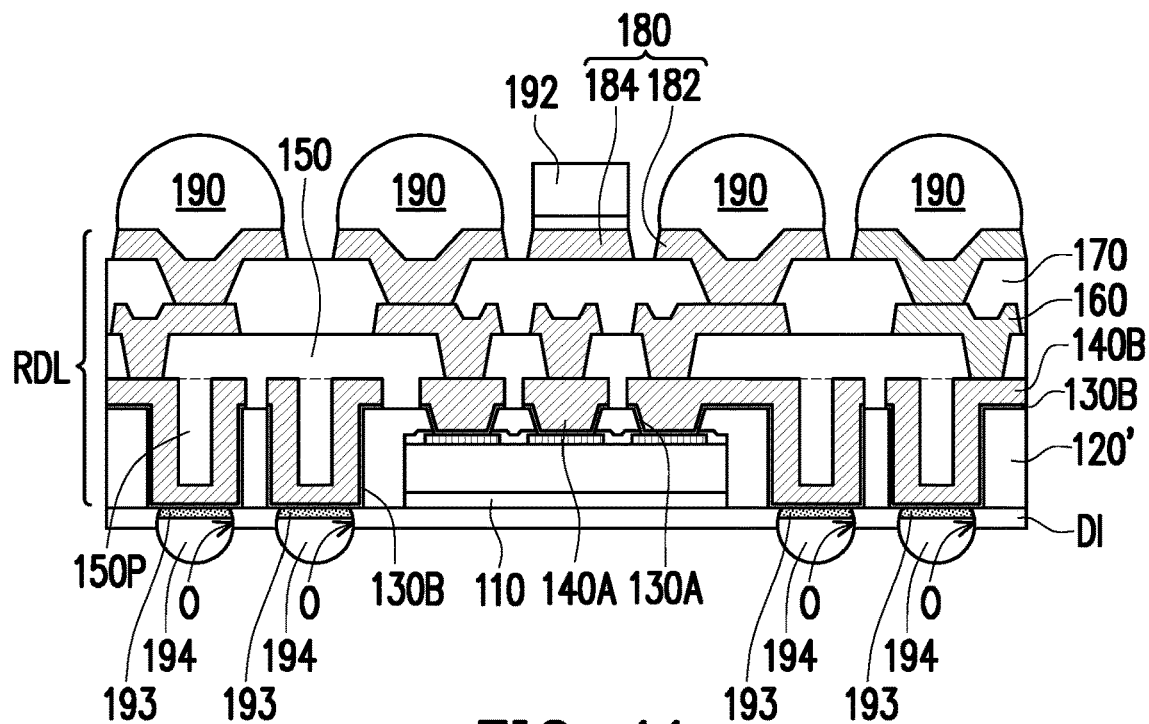

Referring to FIG. 11, after the barrier layers 193 are formed in the second contact openings O, a plurality of conductive terminals 194 (e.g., conductive balls) are placed on barrier layers 193 exposed by the contact openings O. Further, the conductive terminals 194 (e.g., conductive balls) are, for example, reflowed to bond with the barrier layers 193. In other words, the barrier layer 193 are electrically connected to the conductive terminals 194 and the second conductive patterns 140B. As shown in FIG. 11, after the conductive balls 190 and the conductive terminals 194 are formed, an integrated fan-out package of the die 100 having dual-side terminals is accomplished.

Figure 12:
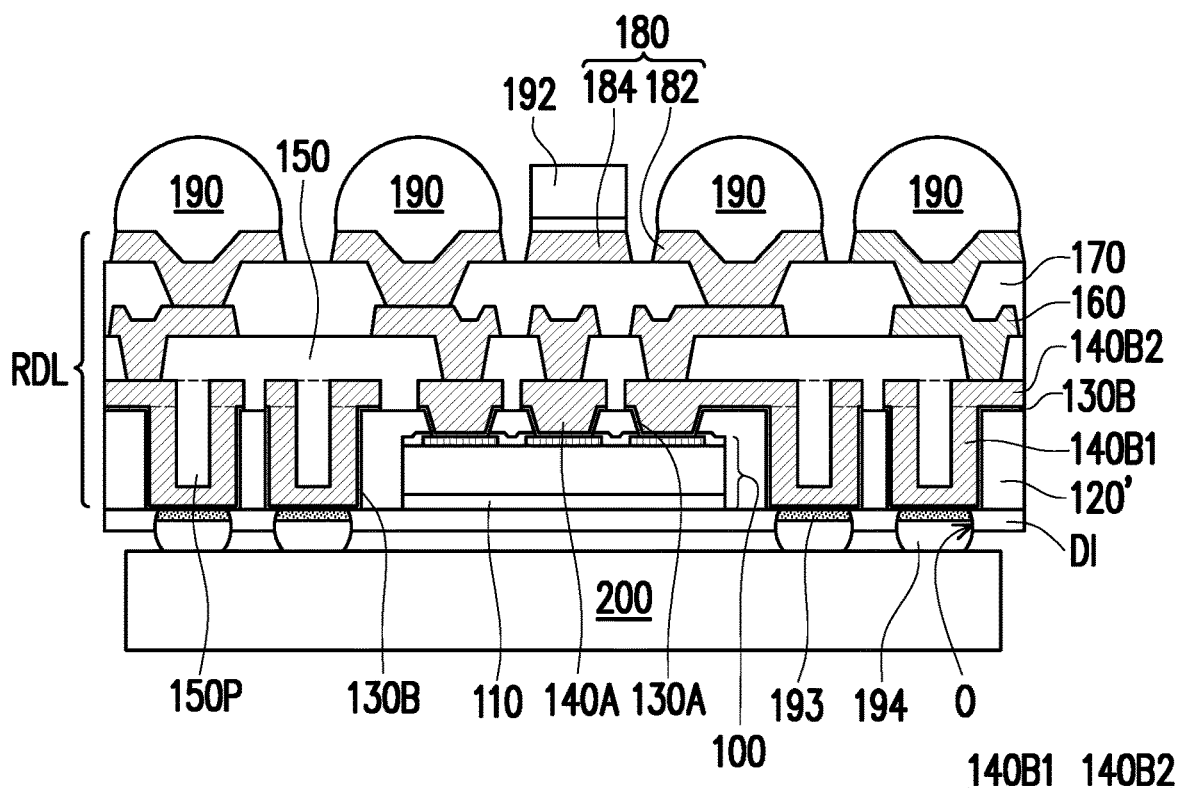

Referring to FIG. 12, in some embodiments, the barrier layer 193 is disposed or sandwiched between the second conductive pattern 140B (or the conductive through via 140B1) and the conductive terminal 194. Also, the barrier layer 193 is disposed or sandwiched between the second seed pattern 130B and the conductive terminal 194. In some alternative embodiments, the barrier layer 193 is in contact with the second seed pattern 130B.

Referring back to FIG. 10, in some embodiments, the barrier layer 193 is not formed in the through holes 124 and the first contact opening 122. Thus, the first seed layer 130A at the sidewall of the first contact opening 122 and at the top of the insulating encapsulation 120' is sandwiched between and in contact with the insulating encapsulation 120' and the first conductive pattern 140A. Further, the first seed pattern 130A at the bottom of the first contact opening 122 is sandwiched between and in contact with the pad 102 and the first conductive pattern 140A. In other words, the bottom surface of the first seed pattern 130A at the bottom of the first contact opening 122 is coplanar with the top surface of the pad 102.

On the other hand, the second seed pattern 130B at the sidewall of the through holes 124 and at the top of the insulating encapsulation 120' is sandwiched between and in contact with the insulating encapsulation 120' and the second conductive pattern 140B. Further, in some embodiments, the width W1 of the second seed patterns 130B at the bottom of the through holes 124 is larger than the width W2 of the barrier layer 193. That is, the second seed pattern 130B at the bottom of the through holes 124 is sandwiched between and in contact with the barrier layer 193 and the second conductive pattern 140B, and is sandwiched between and in contact with the dielectric layer DI and the second conductive pattern 140B. In other words, the bottom surface of the second seed patterns 130B at the bottom of the through holes 124 is coplanar with the top surfaces of the barrier layer 193 and the dielectric layer DI.

Referring to FIG. 12, another package 200 is then provided. In some embodiments, the package 200 is, for example, a memory device. The package 200 is stacked over and is electrically connected to the integrated fan-out package illustrated in FIG. 10 through the conductive balls 194 such that a package-on-package (POP) structure is fabricated.

In the above-mentioned embodiments, since the fabrication process of the conductive through vias in the insulating encapsulation is integrated into the fabrication process of the bottommost redistribution conductive layer of the redistribution circuit structure, the fabrication costs of the integrated fan-out packages may be reduced and the fabrication process of the integrated fan-out packages is simple. Furthermore, the barrier layer between the conductive terminal and the conductive through via is able to reduce the inter-metallic compound including the material of the conductive terminal and the conductive through via, so as to lower the crack risk after the reflow process.

In accordance with some embodiments of the present disclosure, a package structure includes a die; an electrically connecting structure having a die attach region and a peripheral region surrounding the die attach region, wherein the die is disposed on the electrically connecting structure within the die attach region; an insulating protrusion disposed in the peripheral region and extending in a thickness direction of the die; a conductive structure disposed on the electrically connecting structure and encapsulating the insulating protrusion, wherein the conductive structure is electrically coupled to the electrically connecting structure and the die; and a dielectric structure disposed on the electrically connecting structure and encapsulating the die and the conductive structure.

In accordance with some embodiments of the present disclosure, a method of fabricating a package structure includes: providing a carrier having a dielectric layer thereon, wherein the dielectric layer has a die attach region and a peripheral region surrounding the die attach region; mounting a die over the dielectric layer within the die attach region; forming a redistribution circuit structure over the dielectric layer, wherein the redistribution circuit structure comprises an insulating protrusion formed in the peripheral region and extending along a thickness direction of the die, and a conductive structure encapsulating the insulating protrusion; releasing the carrier to expose the dielectric layer; patterning the dielectric layer to form a plurality of openings in the peripheral region, wherein a portion of the conductive structure is exposed by the plurality of openings; respectively forming a plurality of barrier layers in the plurality of openings; and respectively forming a plurality of conductive terminals over the plurality of barrier layers.

In accordance with some embodiments of the present disclosure, a package structure includes a die; an electrically connecting structure having a die attach region and a peripheral region surrounding the die attach region, wherein the die is disposed on the electrically connecting structure within the die attach region; a redistribution circuit structure over the electrically connecting structure, wherein the redistribution circuit structure comprises: an insulating protrusion disposed in the peripheral region, and extending along a thickness direction of the die; and a first redistribution conductive layer encapsulating the insulating protrusion, and electrically coupled to the electrically connecting structure and the die; a first inter-dielectric layer overlying the first redistribution conductive layer; and a second redistribution conductive layer overlying the first inter-dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a dielectric layer having a first surface and a second surface opposite to each other, and having an opening extending from the first surface to the second surface;
   a die disposed over the second surface of the dielectric layer;
   an insulating encapsulation disposed on the second surface of the dielectric layer and encapsulating the die;
   a second conductive pattern disposed aside the die, and extending from an upper surface of the insulating encapsulation to a lower surface of the insulating encapsulation to form a conductive via having a U-shaped cross-section, wherein a bottom horizontal portion of the U-shaped cross-section of the conductive via is exposed by the opening of the dielectric layer; and
   a barrier layer disposed in the opening of the dielectric layer, wherein a width of the barrier layer is less than a width of the bottom horizontal portion of the U-shaped cross-section of the conductive via,
   wherein the die is attached to the second surface of the dielectric layer through a die-attach film (DAF), and a bottom surface of the DAF is substantially level with a bottom surface of the bottom horizontal portion of the U-shaped cross-section of the conductive via.

2. The package structure of claim 1, wherein the barrier layer is in direct contact with the bottom horizontal portion of the U-shaped cross-section of the conductive via.

3. The package structure of claim 1, wherein a material of the barrier layer comprises a metal comprising Ni, Au, Pd, Co, or a combination thereof.

4. The package structure of claim 1, wherein a minimum thickness of the barrier layer is greater than 0.5 µm.

5. The package structure of claim 1, further comprising:
   a conductive terminal disposed in the opening of the dielectric layer, wherein the barrier layer is vertically sandwiched between the bottom horizontal portion of the U-shaped cross-section of the conductive via and the conductive terminal; and
   a package bonding to the first surface of the dielectric layer by the conductive terminal.

6. The package structure of claim 5, wherein a width of the conductive terminal is less than the width of the bottom horizontal portion of the U-shaped cross-section of the conductive via.

7. The package structure of claim 1, further comprising:
   a first conductive pattern extending from the upper surface of the insulating encapsulation to an active surface of the die; and an inter-dielectric layer disposed over the upper surface of the insulating encapsulation, the first conductive pattern and the second conductive pattern, wherein the inter-dielectric layer has a protrusion extending in the conductive via.

8. The package structure of claim 7, wherein the first conductive pattern is connected to the second conductive pattern at the upper surface of the insulating encapsulation.

9. A method of fabricating a package structure, comprising:
forming a dielectric layer having a first surface and a second surface opposite to each other;
mounting a die over the second surface of the dielectric layer;
forming an insulating encapsulation on the second surface of the dielectric layer to encapsulate the die;
forming a second conductive pattern aside the die, wherein the second conductive pattern extends from an upper surface of the insulating encapsulation to a lower surface of the insulating encapsulation to form a conductive via having a U-shaped cross-section;
forming an opening extending from the first surface to the second surface in the dielectric layer, wherein a bottom horizontal portion of the U-shaped cross-section of the conductive via is exposed by the opening of the dielectric layer; and
forming a barrier layer in the opening of the dielectric layer, wherein a width of the barrier layer is less than a width of the bottom horizontal portion of the U-shaped cross-section of the conductive via,
wherein the die is attached to the second surface of the dielectric layer through a die-attach film (DAF), and a bottom surface of the DAF is substantially level with a bottom surface of the bottom horizontal portion of the U-shaped cross-section of the conductive via.

10. The method of claim 9, wherein the barrier layer is in direct contact with the bottom horizontal portion of the U-shaped cross-section of the conductive via.

11. The method of claim 9, further comprising:
forming a conductive terminal in the opening of the dielectric layer, wherein the barrier layer is vertically sandwiched between the bottom horizontal portion of the U-shaped cross-section of the conductive via and the conductive terminal; and
bonding a package to the first surface of the dielectric layer by the conductive terminal.

12. The method of claim 11, wherein a width of the conductive terminal is less than the width of the bottom horizontal portion of the U-shaped cross-section of the conductive via.

13. The method of claim 10, further comprising:
forming a first conductive pattern, wherein the first conductive pattern extends from the upper surface of the insulating encapsulation to an active surface of the die; and
forming an inter-dielectric layer over the upper surface of the insulating encapsulation, the first conductive pattern and the second conductive pattern, wherein the inter-dielectric layer has a protrusion extending in the conductive via.

14. The method of claim 10, wherein a material of the plurality of barrier layer comprises an electroless metal comprising electroless Ni, electroless Au, electroless Pd, electroless Co, or a combination thereof.

15. The method of claim 9, wherein a minimum thickness of the barrier layer is greater than 0.5 µm.

16. A package structure, comprising:
a dielectric layer having a first surface and a second surface opposite to each other, and having an opening extending from the first surface to the second surface;
a die disposed over the second surface of the dielectric layer;
an insulating encapsulation disposed on the second surface of the dielectric layer and encapsulating the die;
a second conductive pattern disposed aside the die, and extending from an upper surface of the insulating encapsulation to a lower surface of the insulating encapsulation to form a conductive via having a U-shaped cross-section, wherein a bottom horizontal portion of the U-shaped cross-section of the conductive via is exposed by the opening of the dielectric layer;
a conductive terminal disposed in the opening of the dielectric layer, wherein a width of the conductive terminal is less than a width of the bottom horizontal portion of the U-shaped cross- section of the conductive via;
a first conductive pattern extending from the upper surface of the insulating encapsulation to an active surface of the die; and
an inter-dielectric layer disposed over the upper surface of the insulating encapsulation, the first conductive pattern and the second conductive pattern, wherein the inter-dielectric layer has a protrusion extending in the conductive via.

17. The package structure of claim 16, further comprising:
a barrier layer disposed in the opening of the dielectric layer, wherein the barrier layer is vertically sandwiched between the bottom horizontal portion of the U-shaped cross-section of the conductive via and the conductive terminal; and
a package bonding to the first surface of the dielectric layer by the conductive terminal.

18. The package structure of claim 17, wherein the barrier layer is in direct contact between the bottom horizontal portion of the U-shaped cross-section of the conductive via and a top of the conductive terminal.

19. The package structure of claim 17, wherein a material of the barrier layer comprises a metal comprising Ni, Au, Pd, Co, or a combination thereof.

20. The package structure of claim 17, wherein the first conductive pattern is connected to the second conductive pattern at the upper surface of the insulating encapsulation.

* * * * *